US011036900B2

(12) United States Patent
Lee et al.

(10) Patent No.: US 11,036,900 B2
(45) Date of Patent: Jun. 15, 2021

(54) SIMULATION DEVICE OF SATELLITE, AND METHOD THEREFOR

(71) Applicant: KOREA AEROSPACE RESEARCH INSTITUTE, Daejeon (KR)

(72) Inventors: Hoonhee Lee, Daejeon (KR); Dawoon Jung, Daejeon (KR)

(73) Assignee: KOREA INSTITUTE AEROSPACE RESEARCH INSTITUTE

( * ) Notice: Subject to any disclaimer, the term of this patent is extended or adjusted under 35 U.S.C. 154(b) by 470 days.

(21) Appl. No.: 15/773,370

(22) PCT Filed: Jan. 5, 2016

(86) PCT No.: PCT/KR2016/000022
§ 371 (c)(1),
(2) Date: May 3, 2018

(87) PCT Pub. No.: WO2017/078221
PCT Pub. Date: May 11, 2017

(65) Prior Publication Data
US 2018/0314775 A1    Nov. 1, 2018

(30) Foreign Application Priority Data
Nov. 6, 2015   (KR) .................. 10-2015-0155455

(51) Int. Cl.
*G06F 30/20*   (2020.01)
*G09B 9/52*   (2006.01)
(Continued)

(52) U.S. Cl.
CPC .............. *G06F 30/20* (2020.01); *B64G 1/24* (2013.01); *G01S 19/23* (2013.01); *G09B 9/52* (2013.01)

(58) Field of Classification Search
None
See application file for complete search history.

(56) References Cited

U.S. PATENT DOCUMENTS

2006/0100752 A1* 5/2006 Kim .................. B64G 3/00
                                                      701/13
2006/0100846 A1   5/2006 Lee et al.
(Continued)

FOREIGN PATENT DOCUMENTS

JP   H10104333 A   4/1998
JP   H10104334 A   4/1998
(Continued)

OTHER PUBLICATIONS

EPO, "Extended European Search Report", Application No. 16862240. 5, May 22, 2019, 8 pages.

*Primary Examiner* — Bijan Mapar
(74) *Attorney, Agent, or Firm* — Dorsey & Whitney LLP

(57) ABSTRACT

Provided is a simulation device of a satellite, which updates a set value of a simulator, using a command signal transmitted to the satellite, operational data received from the satellite, and flight information. The simulation device of the satellite may comprise: a communication unit for receiving operational data from the satellite, and transmitting a command signal to the satellite; a flight control unit for calculating flight information of the satellite, using the received operational data; and an updating unit for updating a set value used for simulating an operation of the satellite, using at least one of the operational data, the command signal, and the flight information.

16 Claims, 4 Drawing Sheets

(51) Int. Cl.
*B64G 1/24* (2006.01)
*G01S 19/23* (2010.01)

(56) References Cited

U.S. PATENT DOCUMENTS

| | | | | |
|---|---|---|---|---|
| 2007/0129922 A1* | 6/2007 | Lee | ............... | B64G 1/244 703/13 |
| 2008/0082222 A1* | 4/2008 | Kim | ............... | B64G 1/244 701/3 |
| 2008/0275598 A1* | 11/2008 | Schwartz | ............ | B64G 1/242 701/13 |

FOREIGN PATENT DOCUMENTS

| | | | |
|---|---|---|---|
| JP | 2002148327 A | 5/2002 | |
| JP | 2004150901 A | 5/2004 | |
| KR | 100611098 B1 | 8/2006 | |
| KR | 100842105 B1 | 6/2008 | |
| KR | 1020110003429 A | 1/2011 | |
| KR | 20110050298 A | 5/2011 | |
| KR | 20140073176 A | 6/2011 | |
| WO | 2000025211 A1 | 5/2000 | |
| WO | 2004048197 A1 | 6/2004 | |
| WO | 2005057409 A1 | 6/2005 | |

\* cited by examiner

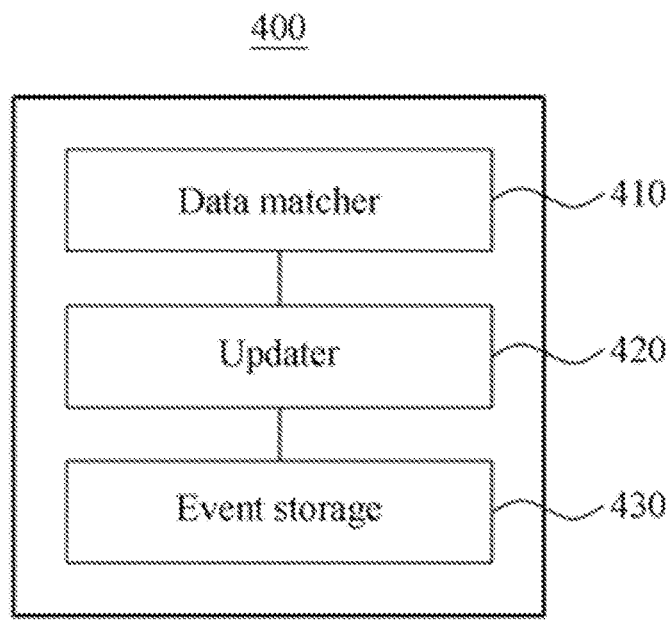

Fig. 4

| Identification label | Subset of extracted operating data | Subset of extracted simulation model state set |
|---|---|---|
| 01 | Telecommand | Simulation command |
| 02 | Remotely measured value<br>Attitude of satellite<br>Position of satellite | Output variable of simulation model |
| 03 | Ephemeris of satellite<br>Space event | Parameter of simulation model |
| 04 | Mission plan | Mission plan of simulation |

Fig. 5

SIMULATION DEVICE OF SATELLITE, AND METHOD THEREFOR

TECHNICAL FIELD

The present invention relates to a simulation apparatus of a satellite and a method therefor, and more particularly, to a simulation method and apparatus using operational data received from a satellite to increase accuracy.

BACKGROUND ART

In order to remotely control a satellite, a terrestrial antenna management, a mission planning of a mission planning subsystem (MPS), a flight dynamics calculation of a flight dynamics subsystem (FDS), a real time operation management of a real time operation subsystem (ROS), a payload data management (PDM), and a simulation may be performed. In general, software corresponding to each function was developed independently, and connections between independent modules were limited to the purpose of remotely controlling the satellite.

Since a simulator is used to check and test functions of other modules, implementing a simulation environment as similar as possible to the actual flight environment of the satellite is important in increasing simulation accuracy and reliability.

DISCLOSURE OF INVENTION

Technical Solutions

According to an aspect of the present invention, there is provided a simulation apparatus of a satellite, the apparatus using telecommands sent to a satellite and operational data and flight information telemetry received from a satellite to update simulation parameters. The simulation apparatus of satellite receives operational data from a satellite, and includes an updater that is configured to update parameters of a simulation of the satellite based on information from at least one of a communicator configured to receive operational data from the satellite, an FDS configured to calculate flight dynamics of the satellite based on the received operational data, operational data from the satellite, telecommands sent to the satellite, and operational data and flight dynamics telemetry received from the satellite.

The updater may be configured to compare an operational data #1 and a simulated value #1 corresponding to the operational data #1 and update the simulated value #1 to be the operational data #1 when the difference between the operational data #1 and the simulated value #1 is greater than or equal to a threshold.

When a simulation is in a paused or terminated state, the updater may be configured to update the simulated value based on at least one of the operational data, telecommands, and flight dynamics information.

The updater may be configured to compare telecommands and simulated telecommands and update the simulated value using telecommands that are not simulated.

The FDS may be configured to calculate at least one of a position of the satellite, an attitude of the satellite, an ephemeris of the satellite, a time at which the operational data is received, and a space event to be observed at the time, as the flight dynamics information based on the operational data.

The simulation apparatus may further include a database configured to match the received operational data and a simulation model state set simulated using the updated simulated value and store a result of the matching and an identification label, and a MPS configured to monitor a mission plan of the satellite using the simulation model state set.

According to another aspect of the present invention, there is also provided a simulation apparatus of a satellite, the apparatus including a processor, a data matcher configured to match at least one item of operational data received from a satellite and at least one simulated value for simulating an operation of the satellite, an updater configured to compare an operational data #1 and a simulated value #1 corresponding to the operational data #1 and update the simulated value #1 to the value of the operational data #1 when the comparison satisfies a predetermined condition, and an event storage configured to manage an update record associated with the at least one simulated value, wherein the data matcher, the updater, and the event storage are at least temporarily implemented by the processor.

The event storage may be configured to transmit, to the simulation apparatus, a notification signal including at least one of the type of the simulated value #1, the updated size of the simulated value #1, and the update time of the simulated value #1.

When a difference value between the operational data #1 and the simulated value #1 is greater than or equal to a threshold and the simulation apparatus is in a paused state, the updater may be configured to update the simulated value #1 to the value of the operational data #1.

The data matcher may be configured to take a telecommand transmitted to the satellite as the operational data #1, and match it with the simulated value #1 including simulated telecommands.

The data matcher may be configured to take the simulated value #1 including an input/output variables of a simulation model, and match it with the operational data #1 which includes at least one of a measured value received from the satellite, attitude of the satellite, and position of the satellite.

The data matcher may be configured to take the simulated value #1 including parameters of a simulation model, and match it with the operational data #1 which includes at least one of ephemeris information of the satellite and space event information.

The data matcher may be configured to match an identification label of the simulated value #1 and an identification label of the operational data #1 received from the satellite.

According to still another aspect of the present invention, there is also provided a simulation apparatus of a satellite, the apparatus including a database configured to store a simulation model state set corresponding to operational data of a satellite, a data manager configured to input an identification label by matching an operational data #1 and a simulated value #1 of the simulation model state set, and a MPS configured to monitor a mission plan of the satellite using the simulation model state set.

When the data manager calculates a difference value between the operational data #1 and the simulated value #1 to be greater than or equal to a threshold, the MPS may be configured to update the mission plan based on the first operational data.

According to yet another aspect of the present invention, there is also provided a non-transitory computer-readable storage medium storing a program for simulating an operation of a satellite, wherein the program includes an instruction set executed to match operational data received from the satellite and a simulated value for simulating an operation of the satellite, an instruction set executed to compare the matched simulated value and the operational data, and an instruction set executed to update the simulated value with the operational data based on a comparison result when a predetermined condition is satisfied.

BRIEF DESCRIPTION OF DRAWINGS

FIG. 4 is a block diagram illustrating a simulation apparatus of a satellite according to an example embodiment.

FIG. 5 is a diagram illustrating an example of a simulation model state set and operational data matching each other according to an example embodiment.

BEST MODE FOR CARRYING OUT THE INVENTION

Hereinafter, example embodiments will be described in detail with reference to the accompanying drawings. It should be understood, however, that there is no intent to limit this disclosure to the particular example embodiments disclosed. On the contrary, example embodiments are to cover all modifications, equivalents, and alternatives falling within the scope of the example embodiments.

Although terms such as "first," "second," and "third" may be used herein to describe various members, components, regions, layers, or sections, these members, components, regions, layers, or sections are not to be limited by these terms. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Figure 1:
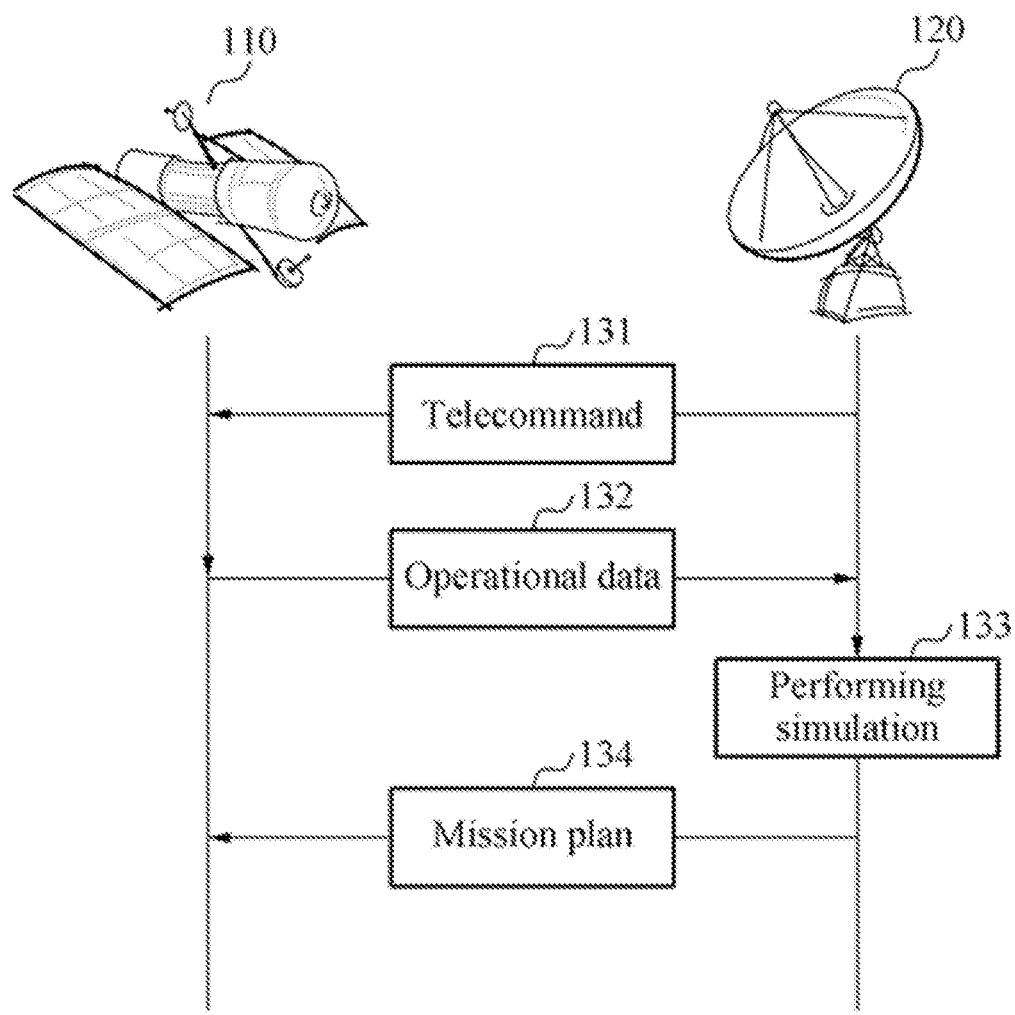
FIG. 1 is a diagram illustrating an example of data transmission and reception performed between a satellite and a control center according to an example embodiment.

FIG. 1 is a diagram illustrating an example of data transmission and reception performed between a satellite and a control center according to an example embodiment.

FIG. 1 illustrates a satellite 110 that travels in space and a control center 120 that controls the flight of the satellite 110. The satellite 110 may receive a command signal (hereinafter also referred to as "telecommand") 131 including a mission plan and a flight schedule from the control center 120 on the ground. Specifically, the telecommand 131 may include a flight schedule of the satellite 110 corresponding to a predetermined period of time.

For example, when the satellite 110 observes a missile facility located in a predetermined region, the control center 120 may transmit the telecommand 131 including a time for the satellite 110 to observe the missile facility, an ephemeris to be maintained by the satellite 110 during the mission, and an attitude of the satellite 110 on a weekly basis. In response to the telecommand 131 being received from the control center 120, the satellite 110 may perform the mission by changing flight speed, flight position, and flight attitude corresponding to time tags for a predetermined period of time, for example, a week.

Also, the satellite 110 may transmit operational data 132 to the control center 120. Operational data may include a variety of data obtained in an operational process such as flight data and input and output data associated with the satellite 110 as well as telemetry measured while the satellite 110 performs its mission in space.

In an example, the operational data 132 may include visible wavelength image data measured using reflected sunlight. In another example, the operational data 132 may include thermal infrared image data acquired using thermal infrared energy emitted from the ground surface or the atmosphere. In still another example, the operational data 132 may include space event information associated with, for example, lunar eclipses, solar eclipses, and the like. The operational data 132 may include a variety of forms of data to be observed by the satellite 110.

In terms of data transmission and reception performed between the satellite 110 and the control center 120, the drawing illustrates that the control center 120 receives the operational data 132 after the telecommand 131 is transmitted from the control center 120 as an example. However, embodiments are not limited to the example. It is obvious to those skilled in the art that the data transmission and reception is performed through various types of synchronous or asynchronous communications such as a configuration in which the control center 120 receives operational data form the satellite 110 and then transmits a telecommand or a configuration in which the control center 120 receives a plurality of items of operational data and transmits a plurality of telecommands.

The control center 120 may perform simulation 133 by calculating a flight plan, a mission plan, and the like using the operational data 132 received from the satellite 110. The control center 120 may update at least one of parameters, simulated values, and input and output variables for performing the simulation 133 based on the operational data 132.

Also, the control center 120 may calculate flight dynamics information for performing the simulation 133 based on the operational data 132. The flight dynamics information includes at least one of a flight attitude, for example, flight pose, ephemeris, position, and space event information.

In related arts, simulators used in the control center 120 may not perform synchronization or update for a simulation platform. In general, a simulator may be developed and delivered before launching. Also, to update the simulator, observation data of the satellite 110 may need to be provided to an outside developer.

In the present disclosure, the simulation apparatus in the control center 120 may automatically use the operational data 132 received from the satellite 110. In addition, the simulation apparatus may be autonomously updated based on a feedback structure. Through this, the satellite 110 may be more accurately simulated.

The control center 120 may calculate a mission plan 134 using an updated result of the simulation 133 and transfer the calculated mission plan 134 to the satellite 110, so that it is possible to control the satellite 110 with increased accuracy.

Figure 2:
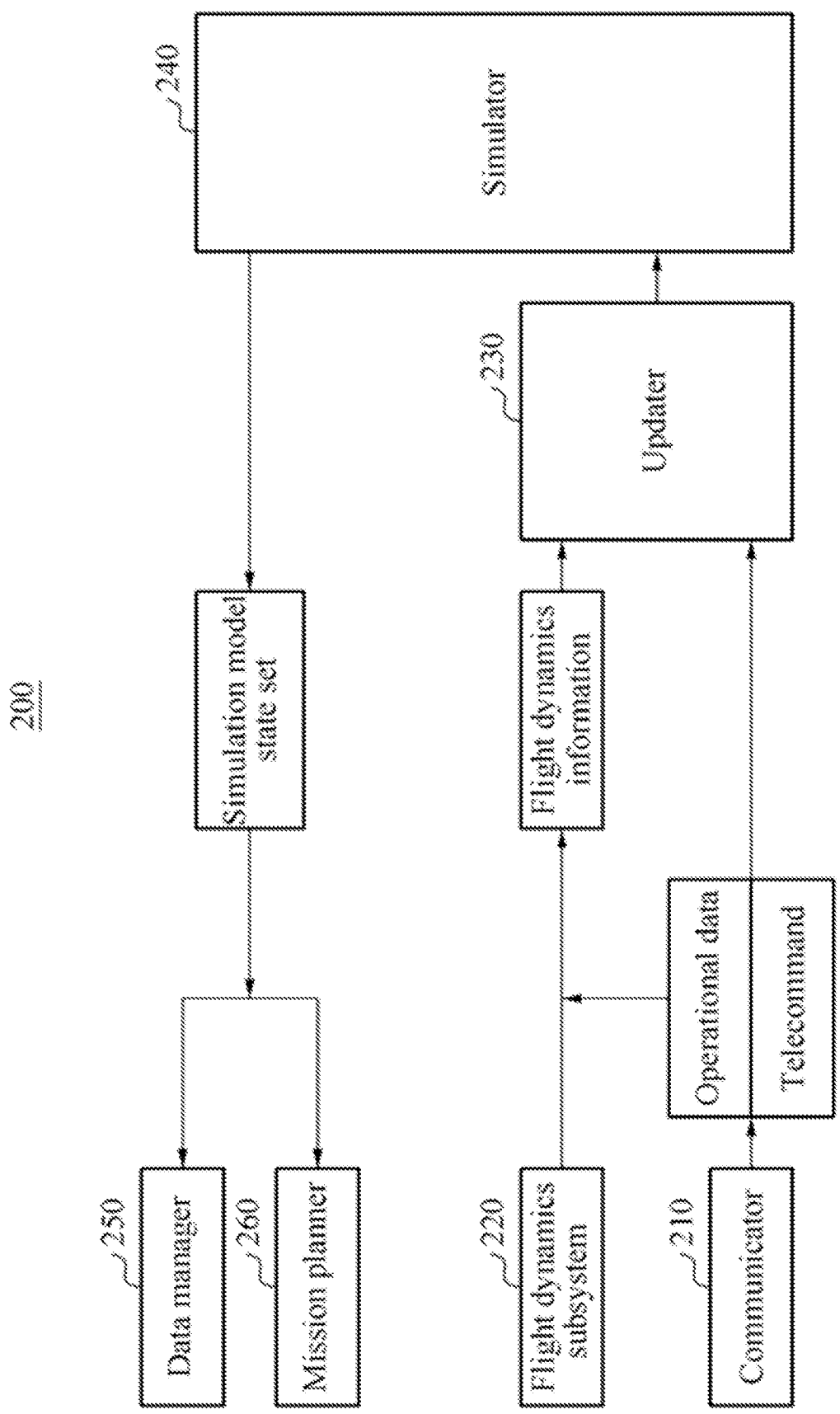
FIG. 2 is a diagram illustrating an example of a data processing performed in a simulation apparatus of a satellite according to an example embodiment.

FIG. 2 is a diagram illustrating an example of a data processing performed in a simulation apparatus of a satellite according to an example embodiment. A simulation apparatus 200 of a satellite may be at least temporarily implemented by a processor. Referring to FIG. 2, the simulation apparatus 200 may include a communicator 210, a Flight Dynamics Subsystem (FDS) 220, an updater 230, a simulator 240, a data manager 250, and a mission planner, for example, a Mission Planning Subsystem (MPS) 260.

The communicator 210 may receive operational data from the satellite or transmit a telecommand to the satellite. The communicator 210 may include a database and store a time tag and at least one of the operational data and the telecommand in the database. The communicator 210 may transmit a data transmission history of data transmitted and received between the satellite and a control center, to the simulator 240 using the database. For example, the data transmission history may include a telecommand #1 corresponding to a time tag #1 or operational data #1 corresponding to a time tag #2.

The operational data received from the satellite may include at least one of an angle at which a sunlight is incident on the satellite, a brightness and colors of stars observed from the satellite, and the Earth's magnetic field sensed by the satellite.

The FDS 220 may calculate flight dynamics information of the satellite in real time based on at least one of telecommand and operational data. The flight dynamics information may include at least one of space events observed at the satellite, ephemeris of the satellite, attitude of the satellite, and position of the satellite acquired in a predetermined period of time or in real time.

When the communicator 210 receives the brightness and color of the star Polaris as operational data, the FDS 220 may compare the received operational data to star catalog information and calculate accurate flight dynamics information corresponding to the satellite in real time.

The updater 230 may receive at least one of operational data and telecommands from the communicator 210. Also, the updater 230 may receive newly calculated flight dynamics information from the FDS 220.

The updater 230 may determine whether to update a simulated value of the simulator 240 using at least one of operational data, telecommands, and flight dynamics information. A process of determining, by the updater 230, whether to update the simulated value of the simulator 240 will be further described with the accompanying drawings.

More specifically, a simulated value of the simulator 240 may be a value comprising part of the platform that the simulator 240 runs on. The simulated value may be a variable used for defining at least one of a simulation command, an input and output variable of a simulation model, a parameter of the simulation model, and a mission plan of the simulation.

When the updater 230 updates the simulated value of the simulator 240 the simulator 240 may use the updated simulated value to perform a simulation of a space environment with increased accuracy. The simulator 240 may transmit a simulation model state set that is generated as a result of the simulation to at least one of the data manager 250 and MPS 260.

The data manager 250 may match received operational data and the simulation model state set transmitted from the simulator 240 and store a result of the match together with an identification label. The simulation apparatus 200 may provide a user with actual current operational data measured by the satellite and the simulation model state set, simultaneously. The simulation apparatus 200 may extract a subset of the operational data and a subset of the simulation model state set and provide matching information to the user. For example, at least one of a transmitted telecommand, telemetry, attitude information of the satellite, position information of the satellite, and ephemeris information of the satellite, space event information, and mission planning information may be extracted from the operational data as an element. Also, the simulation model state set may include various state variables to be extracted from the platform while the simulation is performed. The simulation apparatus 200 may extract at least one of a simulation command, an output variable of a simulation model, a parameter of the simulation model, and a mission plan of the simulation as an element of the simulation model state set.

The user may compare the simulation model state set and the actual operational data to verify feasibility of a currently planned mission and verify whether the satellite operates normally. Thus, by using the simulation apparatus 200, it is possible to enhance accuracy of a simulator and efficiently manage a satellite.

The MPS 260 may monitor the mission plan of the satellite using the simulation model state set transmitted from the simulator 240. When a difference value between the simulation model state set and a mission plan corresponding to a currently transmitted telecommand is greater than a threshold, the MPS 260 may generate a new mission plan. The MPS 260 may transmit the new mission plan to the communicator 210. The communicator 210 may transfer a telecommand including the new mission plan to the satellite.

The satellite may be controlled with increased accuracy since the simulation apparatus 200 uses a feedback loop #1 where the simulator 240 is updated based on actual operational data and uses a feedback loop #2 that adjusts the mission plan of a satellite based on a generated simulation model state set.

Figure 3:
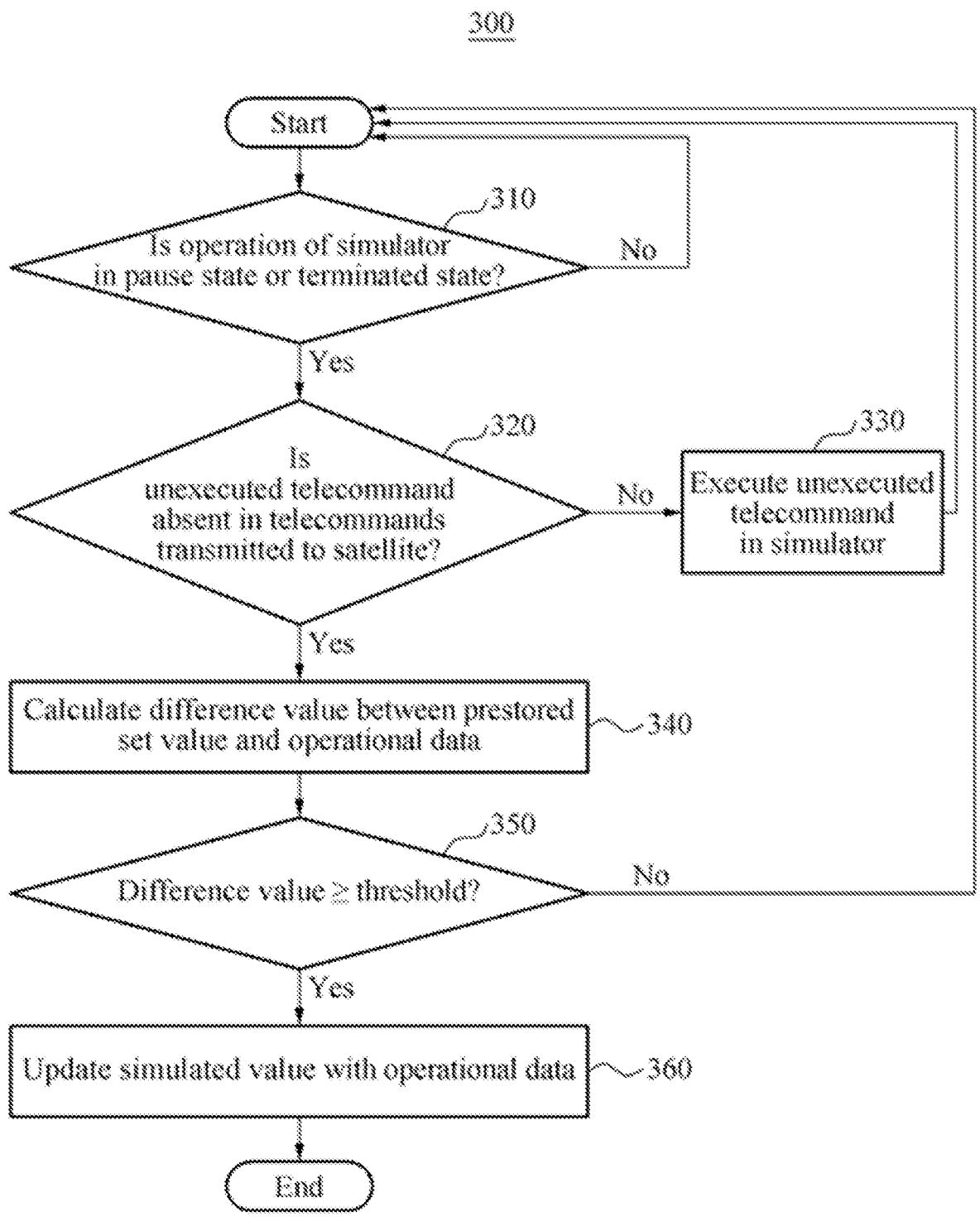
FIG. 3 is a flowchart illustrating a method of determining whether to update a simulated value of a simulator according to an example embodiment.

FIG. 3 is a flowchart illustrating a method of determining whether to update a simulated value of a simulator according to an example embodiment. Referring to FIG. 3, a method 300 of determining whether to update a simulated value of a simulator may include operation 310 of determining whether the operation of a simulator is in a paused state or a terminated state, operation 320 of determining whether telecommands transmitted to a satellite include a telecommand not executed in the simulator, operation 330 of executing the unexecuted telecommand, operation 340 of calculating a difference value between a stored simulated value and operational data, operation 350 of determining whether the difference is greater than or equal to a threshold, and operation 360 of updating the simulated value with the operational data.

In operation 310, a simulation apparatus of a satellite may determine whether the simulator is in a paused or terminated state. In general, data transmission and reception between a satellite and a control center may be performed asynchronously. Because it is difficult to predict the transmission time of new operational data from the satellite, a simulator may be performing an existing simulation that has been started before new operational data is received.

When it is determined that the simulator is performing an existing simulation, operation 310 may further include an operation of performing back-off for a predetermined period of time using the simulation apparatus of the satellite. When a simulation #1 that has been started before is not interrupted in operation 310, the back-off will guarantee sufficient time for generating a simulation model state set #1 corresponding to the simulation #1. In addition, the simulation apparatus may update a telecommand #1 based on the simulation model state set #1 and continuously perform asynchronous data transmission with the satellite.

When the simulation apparatus performs the back-off in operation 310, the simulation apparatus may perform operation 310 again to determine whether an operation of the simulator is in a paused state or a terminated state after the predetermined period of time elapses.

In operation 320, the simulation apparatus may determine whether telecommands transmitted to the satellite include a telecommand not executed in the simulator. When an actually transmitted telecommand differs from the telecommand not executed in the simulator, the difference may cause an error in a simulation model state set. In operation 320, the simulation apparatus may compare an actual telecommand and a simulation telecommand and detect a non-simulated telecommand. When it is determined that the non-simulated telecommand is absent in operation 320, operation 340 may be performed. When it is determined that the non-simulated telecommand is present in operation 330, operation 330 may be performed.

In operation 330, the simulation apparatus may execute the unexecuted telecommand. In operation 330, the simulation apparatus may execute a missing telecommand to prevent accumulation of errors in a simulation input and output variable. Through this, a more accurate simulation model state set can be obtained. When operation 330 is performed, the method 330 of determining whether to update a simulated value of the simulator may be performed again. In operation 340, the simulation apparatus calculates a difference value between a stored simulated value and operational data. Specifically, operation 340 may be an operation of comparing operational data including an identification label corresponding to a stored simulated value and calculating a difference value thereof. For example, the operational data compared in operation 340 may be a subset of overall operational data transmitted from the satellite.

As an example, if an operational data #1 indicates the altitude of the satellite, the simulation apparatus may compare the operational data #1 and a simulated value #1 corresponding to the operational data #1 in operation 340. When the current altitude of the satellite is 560 kilometers (km) and received as the operational data #1 and the simulated value #1 used by the simulator is 620 km, the simulation apparatus may calculate the difference value to be 60 km.

In operation 350, the simulation apparatus may compare the difference calculated in operation 340 to a threshold and determine whether the difference is greater than or equal to the threshold. As described above, the simulation apparatus may obtain the difference value of 60 km in operation 340. When a threshold is set as a value corresponding to 10% of the received first operational data, the simulation apparatus may calculate the threshold to be 56 km. In this example, since the difference value of 60 km is greater than the threshold of 56 km, the simulation apparatus may perform operation 360 following operation 350.

In an example, when the difference value is calculated to be less than the threshold in operation 350, the simulation apparatus may start performing the method 300 of determining whether to update a simulated value of the simulator again.

In operation 360, the simulation apparatus may update the simulated value to the operational data. As discussed above, the simulation apparatus may update the simulated value 620 km to the operational data value 560 km. By performing operation 360 periodically, the simulated values of the simulation apparatus may on average maintain greater accuracy.

FIG. 4 is a block diagram illustrating a simulation apparatus of a satellite according to an example embodiment. A simulation apparatus 400 may include a processor. The simulation apparatus 400 may also include a data matcher 410, an updater 420, and an event storage 430 which are at least temporarily implemented by the processor.

The data matcher 410 may match at least one item of operational data received from a satellite and at least one simulated value that simulates an operation of the satellite. The data matcher 410 may assign an identification label #1 to a matching set of an operational data #1 and a simulated value #1.

In an example, the data matcher 410 may match a telecommand transmitted to the satellite as the operational data #1 and the simulated value #1 including a simulation command.

In another example, the data matcher 410 may match at least one of a remotely measured value, for example, a telemetry received from the satellite, an attitude of the satellite, and a position of the satellite as the operational data #1, and the simulated value #1 including an input and output variable of a simulation model.

In still another example, the data matcher 410 may match at least one of ephemeris information of the satellite and space event information as the operational data #1 and the simulated value #1 including a parameter of a simulation model.

The updater 420 may compare the operational data #1 to the simulated value #1 matching the operational data #1. When a result of the comparison satisfies a predetermined condition, the updater 420 may update the simulated value #1 to be value of the operational data #1. Since the description of FIG. 3 is also applicable here, repeated description of an operation of the updater 420 will be omitted.

The event storage 430 may manage an update history associated with at least one simulated value. When an update is performed on the simulated value #1, the event storage 430 may store at least one of the type of the simulated value #1, the updated size of the simulated value #1, and the update time of the simulated value #1 as event information. Also, the event storage 430 may periodically transmit a notification signal associated with the event information to the simulation apparatus 400 of the satellite. A user of the simulation apparatus 400 may receive a notification signal associated with an event in which a simulated value is changed, allowing the user to verify the current state of the simulator conveniently.

FIG. 5 is a diagram illustrating an example of a simulation model state set and operational data matching each other according to an example embodiment. FIG. 5 illustrates a subset of extracted operational data and a subset of an extracted simulation model state set stored in a database of the data matcher 410. The data matcher 410 may extract a portion of operational data received from a satellite, extracts a portion of a simulation model state set generated by a simulator, and match the extracted portions. It is obvious to those skilled in the art that the data matcher 410 may generate subsets by extracting various combinations of data from overall operational data and simulation model state set.

In identification label 01, a telecommand actually transmitted to the satellite and a simulation command transmitted to a virtual object in the simulation may be matched to each other as an operational data #1 and a simulated value #1 of a simulation model state set.

In identification label 02, the position and attitude of the satellite and a remote operation value that is actually transmitted by the satellite, and an input and output variable of a simulation model may be matched as an operational data #2 and a simulated value #2 of the simulation model state set.

In identification label 03, an ephemeris that is actually transmitted by the satellite and an observable space event, and a parameter of the simulation model may be matched as an operational data #3 and a simulated value #3 of the simulation model state set.

In identification label 04, a mission plan to be actually performed by the satellite and a mission plan assigned to a virtual object in the simulation may be matched as an operational data #4 and a simulated value #4 of the simulation model state set.

The description of FIG. 5 is merely an example of matching operational data and a simulation model state set and thus, embodiments are not limited to the combinations described in the example. A simulation apparatus of a satellite may match elements of a simulation model state set and operational data through various combinations as necessary and assign identification label thereto. A user may use the assigned identification labels to verify actual operational data and the simulation model state set. Through this, the user may verify feasibility of a mission plan or perform qualitative evaluation on acquired data, which may in turn enhance usability of the satellite.

The examples described herein may be implemented using hardware and/or software components. For example, one or more hardware devices configured to carry out and/or execute program code by performing arithmetical, logical, and input/output operations may be used, including processing devices such as processors, controllers, arithmetic logic units, digital signal processors, microcomputers, field programmable arrays, programmable logic units, microprocessors or any other device capable of responding to and executing instructions in a defined manner. The processing device may run an operating system (OS) and one or more software applications that run on the OS. The processing device also may access, store, manipulate, process, and create data in response to execution of the software. For simplicity, it is assumed that a processing device is singular; however, one skilled in the art will appreciate that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The invention claimed is:

1. An asynchronous simulation apparatus for a satellite, the apparatus comprising:
   a communicator configured to receive operational data from a satellite and transmit telecommands to the satellite;
   a Flight Dynamics Subsystem (FDS) implemented in a computer processor configured by first computer program code to receive the operational data from the communicator and calculate actual flight dynamics information of the satellite based on the received operational data;
   an updater implemented in the computer processor configured by second computer program code to update a simulated value stored in a database in communication with the computer processor with an updated simulated value that replaces the simulated value, wherein the updated simulated value corresponds to one or more of the operational data, the telecommands, or the flight dynamics information and the simulated value is updated when a predetermined condition is satisfied; and
   a simulator implemented in the computer processor configured by third program code for asynchronously simulating an operation of the satellite based on the simulated value or the updated simulated value if the simulated value is updated.

2. The asynchronous simulation apparatus of claim 1, wherein the updater is configured to compare a first operational data and a first simulated value corresponding to the first operational data and update the first simulated value to the value of the first operational data when a difference value between the first operational data and the first simulated value is greater than or equal to a threshold, thereby satisfying the predetermined condition.

3. The asynchronous simulation apparatus of claim 1, wherein when a simulation performed by the simulator is in a paused state or a terminated state, the updater is configured to update the simulated value stored in the database based on at least one of the operational data, the telecommands, and the flight dynamics information.

4. The asynchronous simulation apparatus of claim 1, wherein the updater is configured to compare telecommands previously sent to the satellite simulated telecommands and update the simulated value using the telecommands previously sent to the satellite.

5. The asynchronous simulation apparatus of claim 1, wherein the FDS is configured to calculate at least one of a position of the satellite, an attitude of the satellite, an ephemeris of the satellite, a time at which the operational data is received, and space events to be observed at that time, as the actual flight dynamics information based on the received operational data.

6. The asynchronous simulation apparatus of claim 1, further comprising:
a data manager implemented in the computer processor configured by fourth program code to match the received operational data with a simulation model state data set stored in the database simulated comprising the simulated value or the updated simulated value and store a result of the matching tagged with an identification label; and
a Mission Planning Subsystem (MPS) implemented in the computer processor configured by fifth program code to monitor a mission plan of the satellite using the simulation model state data set.

7. An asynchronous simulation apparatus for a satellite, the apparatus comprising:
a computer processor;
a data matcher implemented in the computer processor configured by first computer program code to match at least one item of operational data received from the satellite and at least one simulated value for simulating an operation of the satellite;
an updater implemented in the computer processor configured by second computer program code to compare a first operational data and a first simulated value corresponding to the first operational data, wherein the first simulated value is stored in a database in communication with the computer processor, and to update the first simulated value to an updated simulated value corresponding to a value of the first operational data, which updated simulated value replaces the simulated value in the database, when a result of comparing the the first operational data and the first simulated value satisfies a predetermined condition;
an event storage module implemented in the computer processor configured by third computer program code to manage an update history record associated with at least one simulated value; and
simulator implemented in the computer processor configured by fourth program code for asynchronously simulating an operation of the satellite based on the simulated value or the updated simulated value if the simulated value is updated.

8. The asynchronous simulation apparatus of claim 7, wherein the event storage module is configured to transmit, to the simulator, a notification signal including at least one of a type of the first simulated value, an updated size of the first simulated value, and an update time of the first simulated value.

9. The asynchronous simulation apparatus of claim 7, wherein when a difference value between the first operational data and the first simulated value is greater than or equal to a threshold, thus satisfying the predetermined condition, and the asynchronous simulation apparatus is in a paused state, the updater is configured to update the first simulated value to the value of the first operational data.

10. The asynchronous simulation apparatus of claim 7, wherein
the first simulated value includes a simulation command; and
the data matcher is configured to match a telecommand transmitted to the satellite as the first operational data with the first simulated value.

11. The asynchronous simulation apparatus of claim 7, wherein
the first simulated value includes an input and output variable of a simulation model; and
the data matcher is configured to match the first simulated value with the first operational data, which includes at least one of measured values received from the satellite, an attitude of the satellite, and a position of the satellite.

12. The asynchronous simulation apparatus of claim 7, wherein
the first simulated value includes a parameter of a simulation model; and
the data matcher is configured to match the first simulated value with the first operational data, which includes at least one of ephemeris information of the satellite and space event information.

13. The asynchronous simulation apparatus of claim 7, wherein
the first simulated value includes a first identification label; and
the data matcher is configured to match the first simulated value with the first operational data, which includes a second identification label received from the satellite.

14. An asynchronous simulation apparatus for a satellite, the apparatus comprising:
a database managed by a computer processor configured by first computer program code to store a simulation model state data set corresponding to operational data of a satellite;
a simulator implemented in the computer processor configured by second program code for asynchronously simulating an operation of the satellite based on the simulation model state data set;
a data manager implemented in the computer processor configured by third computer program code to match a first operational data and a first simulated value of the simulation model state data set, assign an identification label to the match, and store the identification label in the database; and
a Mission Planning Subsystem (MPS) implemented in the computer processor configured by second computer program code to monitor a mission plan of the satellite using the simulation model state set.

15. The asynchronous simulation apparatus of claim 14, wherein when the data manager calculates a difference value between the first operational data and the first simulated value to be greater than or equal to a threshold, the MPS is configured to update the mission plan based on the first operational data.

16. A non-transitory computer-readable storage medium storing a computer program for asynchronously simulating an operation of a satellite, wherein the computer program comprises:
   an instruction set executable to simulate operation of the satellite based upon simulated values of parameters for operation of the satellite;
   an instruction set executable to match operational data values received from the satellite with the simulated values;
   an instruction set executable to compare matched simulated values and the operational data values; and
   an instruction set executable to update the simulated values with operational data values when a result of comparing the simulated values with the operational data values satisfies a predetermined condition.

* * * * *